United States Patent
Imai et al.

(10) Patent No.: US 10,141,195 B2
(45) Date of Patent: Nov. 27, 2018

(54) SUBSTRATE PROCESSING METHOD

(71) Applicant: TOKYO ELECTRON LIMITED, Tokyo (JP)

(72) Inventors: Muneyuki Imai, Nirasaki (JP); Noriyuki Kobayashi, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 15/684,326

(22) Filed: Aug. 23, 2017

(65) Prior Publication Data
US 2018/0061657 A1    Mar. 1, 2018

(30) Foreign Application Priority Data

Aug. 24, 2016 (JP) ................. 2016-163623

(51) Int. Cl.
| | |
|---|---|
| *H01L 21/311* | (2006.01) |
| *H01L 21/02* | (2006.01) |
| *H01L 21/768* | (2006.01) |
| *H01L 21/67* | (2006.01) |
| *H01L 21/677* | (2006.01) |

(52) U.S. Cl.
CPC .. *H01L 21/31116* (2013.01); *H01L 21/02115* (2013.01); *H01L 21/02271* (2013.01); *H01L 21/31144* (2013.01); *H01L 21/67207* (2013.01); *H01L 21/67742* (2013.01); *H01L 21/76816* (2013.01); *H01L 21/0217* (2013.01); *H01L 21/0223* (2013.01); *H01L 21/02126* (2013.01); *H01L 21/02164* (2013.01); *H01L 21/02255* (2013.01); *H01L 21/02532* (2013.01); *H01L 21/67017* (2013.01); *H01L 21/67173* (2013.01); *H01L 21/67201* (2013.01); *H01L 21/67706* (2013.01)

(58) Field of Classification Search
CPC ......... H01L 21/31116; H01L 21/76816; H01L 21/02271; H01L 21/02115
See application file for complete search history.

(56) References Cited

U.S. PATENT DOCUMENTS

| | | | |
|---|---|---|---|
| 5,426,070 A * | 6/1995 | Shaw | B81C 1/0015 216/2 |
| 2010/0173494 A1 * | 7/2010 | Kobrin | H01L 21/0337 438/694 |
| 2012/0313170 A1 | 12/2012 | Chang et al. | |

* cited by examiner

*Primary Examiner* — William F Kraig
*Assistant Examiner* — Vicki B Booker
(74) *Attorney, Agent, or Firm* — Nath, Goldberg & Meyer; Jerald L. Meyer

(57) ABSTRACT

There is provided a substrate processing method performed on a substrate having a recess formed in a surface thereof, a first silicon-containing film formed on a bottom surface of the recess, a second silicon-containing film formed on both sides of the recess, the method including: depositing a carbon-based deposit on the surface of the substrate; removing the first silicon-containing film by performing a COR (Chemical Oxide Removal) process in which a silicon-containing film is modified to a reaction product using a processing gas, on the substrate; and removing the deposited carbon-based deposit.

10 Claims, 9 Drawing Sheets

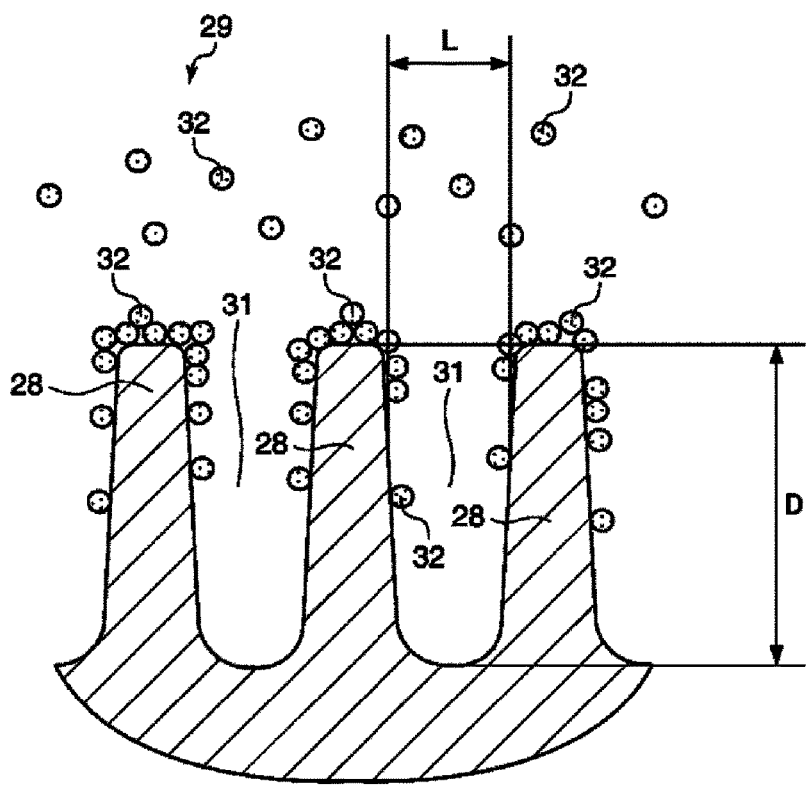

SUBSTRATE PROCESSING METHOD

CROSS-REFERENCE TO RELATED APPLICATION

This application claims the benefit of Japanese Patent Application No. 2016-163623, filed on Aug. 24, 2016, in the Japan Patent Office, the disclosure of which is incorporated herein in its entirety by reference.

TECHNICAL FIELD

The present disclosure relates to a substrate processing method for selectively removing a specific silicon-containing film.

BACKGROUND

In recent years, many semiconductor devices having a multilayer wiring structure have been developed. In the multilayer wiring structure, for example, a fin made of silicon may be formed at the bottom of a recess sandwiched by two interlayer films. Furthermore, in such a structure, a silicon-containing film sometimes covers the fin formed at the bottom. There may be a case where the silicon-containing film is removed to form electrodes or the like. Since the multilayer wiring structure is a very fine and complicated structure, the removal of the silicon-containing film does not require an etching stop layer. An isotropic etching technique may be used to remove the silicon-containing film existing in a fine gap. A chemical etching process, for example, a COR (Chemical Oxide Removal) process is suitably used for the removal of the silicon-containing film.

However, since the interlayer film is also formed of a silicon-containing film, there is a possibility that the interlayer film is removed by the COR process and is made thin. If the interlayer film is made thin, for example, the gate length becomes short, which makes it difficult to control the switching in a transistor. This poses a problem that the yield of a semiconductor device deteriorates.

SUMMARY

Some embodiments of the present disclosure provide a substrate processing method capable of selectively removing a specific silicon-containing film in an environment in which a plurality of silicon-containing films exist.

According to one embodiment of the present disclosure, there is provided a substrate processing method performed on a substrate having a recess formed in a surface thereof, a first silicon-containing film formed on a bottom surface of the recess, a second silicon-containing film formed on both sides of the recess, the method including: depositing a carbon-based deposit on the surface of the substrate; removing the first silicon-containing film by performing a COR (Chemical Oxide Removal) process in which a silicon-containing film is modified to a reaction product using a processing gas, on the substrate; and removing the deposited carbon-based deposit.

BRIEF DESCRIPTION OF THE DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

FIG. 3 is a view for explaining the reason why a deposition film is not formed on a bottom surface of a recess.

DETAILED DESCRIPTION

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

Figure 1:
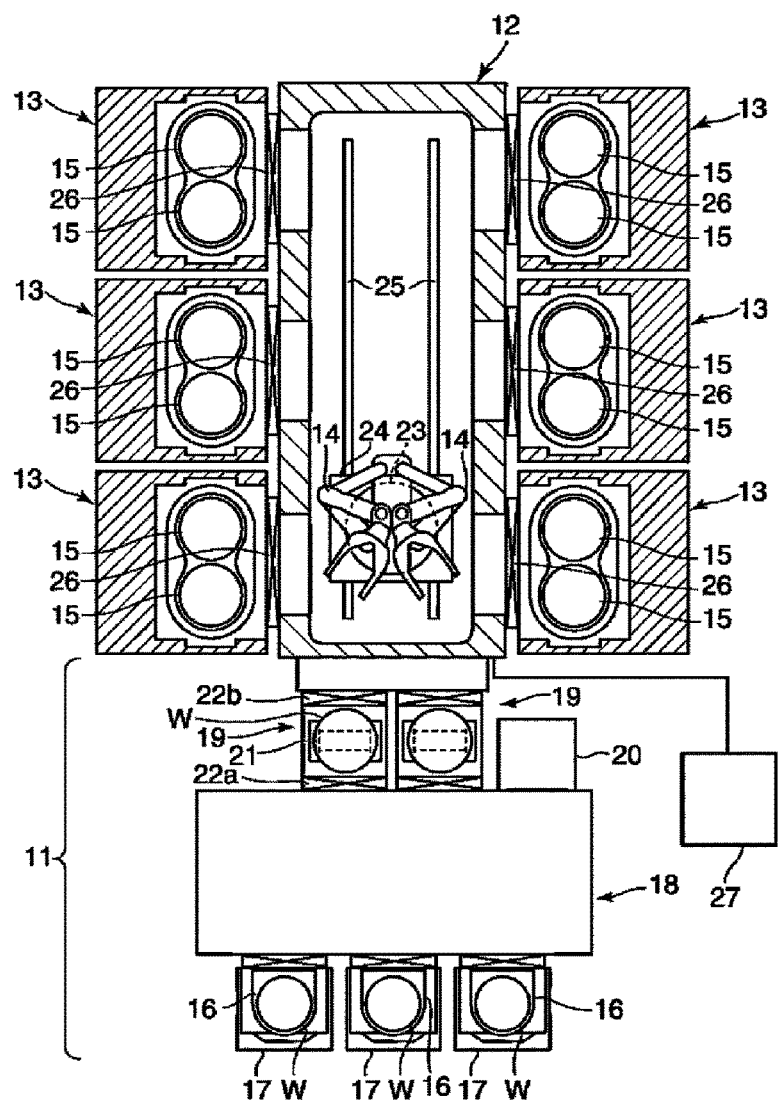
FIG. 1 is a plan view schematically showing a configuration of a substrate processing system that executes a substrate processing method according to an embodiment of the present disclosure.

FIG. 1 is a plan view schematically showing a configuration of a substrate processing system that executes a substrate processing method according to an embodiment of the present disclosure. In FIG. 1, in order to facilitate understanding, a portion of the internal configuration is shown in a see-through manner.

Referring to FIG. 1, a substrate processing system 10 includes a wafer storage part 11 configured to store semiconductor wafers W (hereinafter simply referred to as "wafers") as a plurality of substrates, a transfer module 12 as a transfer chamber configured to simultaneously transfer two wafers W, and a plurality of process modules 13 configured to perform a COR process, a PHT (Post Heat Treatment) process or a film forming process on the wafers W loaded from the transfer module 12. The interior of each of the process modules 13 and the transfer module 12 is maintained in a vacuum atmosphere.

In the substrate processing system 10, the wafers W stored in the wafer storage part 11 are transferred by a transfer arm 14 built in the transfer module 12. The wafers W are mounted one by one on each of two stages 15 arranged inside each of the process modules 13. Subsequently, in the substrate processing system 10, the COR process, the PHT process or the film forming process is performed on the respective wafers W mounted on the stages 15 using each of the process modules 13. Thereafter, the processed wafers W are transferred by the transfer arm 14 to the wafer storage part 11.

The wafer storage part 11 includes a plurality of load ports 17 as mounting stands for FOUPs 16 which are containers configured to store the plurality of wafers W, a loader module 18 configured to receive the stored wafers W from the FOUPs 16 mounted on the respective load ports 17 or configured to transfer the wafers W subjected to a predetermined process in the process modules 13 to the FOUPs 16, two load lock modules 19 configured to temporarily hold the wafers W in order to deliver the wafers W between the loader module 18 and the transfer module 12, and a cooling storage 20 configured to cool the wafers W subjected to the PHT process.

The loader module 18 is formed of a rectangular casing whose interior is kept in an atmospheric pressure atmosphere. The load ports 17 are juxtaposed at one side surface constituting the long side of the rectangular casing. Further, the loader module 18 includes a transfer arm (not shown) movable in the longitudinal direction of the rectangular casing inside the loader module 18. The transfer arm loads the wafers W into the load lock modules 19 from the FOUPs 16 mounted on the respective load ports 17 or unloads the wafers W from the load lock modules 19 to the respective FOUPs 16.

Each of the load lock modules 19 temporarily holds the wafers W so that the wafers W accommodated in the FOUP 16 mounted on each of the load ports 17 kept in the atmospheric pressure atmosphere is delivered to the process module 13 whose interior is kept in a vacuum atmosphere. Each of the load lock modules 19 includes a buffer plate 21 configured to hold two wafers W. Further, each of the load lock modules 19 includes a gate valve 22a for securing airtightness with respect to the loader module 18 and a gate valve 22b for securing airtightness with respect to the transfer module 12. In addition, a gas introduction system and a gas exhaust system (both not shown) are connected to the load lock modules 19 by pipes. The interior of the load lock modules 19 is controlled to be kept in an atmospheric pressure atmosphere or a vacuum atmosphere.

The transfer module 12 loads unprocessed wafers W from the wafer storage part 11 into the process module 13, and unloads processed wafers W from the process module 13 to the wafer storage part 11. The transfer module 12 is composed of a rectangular housing whose interior is kept in a vacuum atmosphere. The transfer module 12 includes two transfer arms 14 configured to hold and move two wafers W, a rotary stand 23 configured to rotatably support the respective transfer arms 14, a rotary mounting table 24 on which the rotary stand 23 is mounted, and guide rails 25 configured to guide the rotary mounting table 24 so as to be movable in the longitudinal direction of the transfer module 12. In addition, the transfer module 12 is connected to the load lock modules 19 of the wafer storage part 11 and the respective process modules 13 via the gate valves 22a and 22b and the respective gate valves 26 to be described later. In the transfer module 12, the transfer arms 14 transfer two wafers W from each of the load lock modules 19 to each of the process modules 13, and unload two processed wafers W from each of the process modules 13 to another process module 13 or each of the load lock modules 19.

Each of the process modules 13 is connected to the transfer module 12 via each of the gate valves 26 and includes two stages 15 installed therein. Each of the process modules 13 further includes a processing gas introduction system, an exhaust mechanism and a plasma generation mechanism (for example, an upper electrode plate to which high frequency power for plasma generation is supplied) which are not shown in the drawings. In the present embodiment, each of process modules 13 executes one of a COR process, a PHT process and a film forming process. In addition, operations of the respective components of the substrate processing system 10 are controlled by a device controller 27 according to a predetermined program.

Figure 2A:
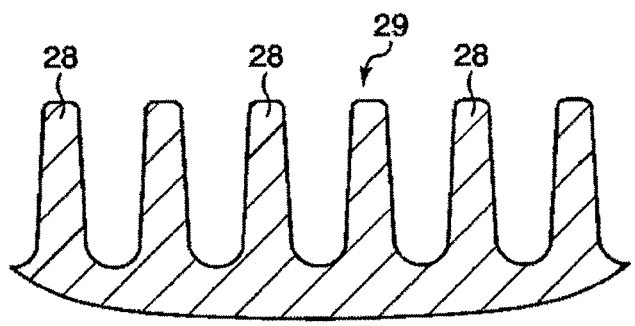
FIGS. 2A to 2D are process diagrams for explaining a shape change in a COR process and a PHT process when a deposition film is formed on a silicon-containing film in which a large number of fins are formed.

Prior to the present disclosure, the present inventors have conducted the following processes. A deposition film 30 was formed on a surface of a silicon-containing film 29 on which a large number of fins 28 are formed as shown in FIG. 2A, using plasma generated from a fluorocarbon-based gas, specifically, an octafluorocyclobutane ($C_4F_8$) gas. Thereafter, a COR process was performed on the silicon-containing film 29 using an ammonia ($NH_3$) gas and a hydrogen fluoride (HF) gas as processing gases. Furthermore, the silicon-containing film 29 was heated and subjected to a PHT process. In the COR process, the silicon-containing film 29 reacts with the ammonia gas and the hydrogen fluoride gas, whereby the silicon-containing film 29 is modified into ammonium fluorosilicate (AFS) as a reaction product. In the PHT process, AFS is sublimed by heating. That is to say, the silicon-containing film 29 is cut by the COR process and the PHT process.

Figure 2B:
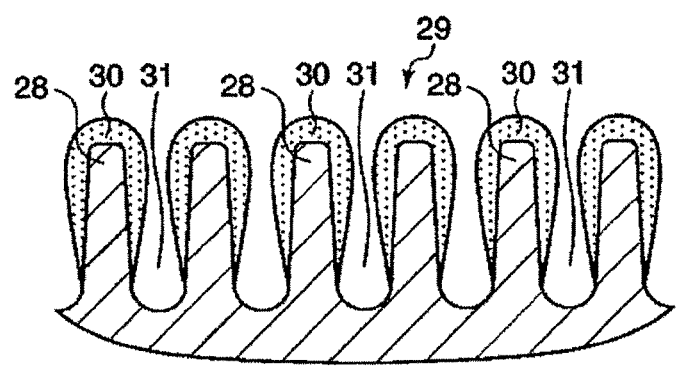
Figure 2C:
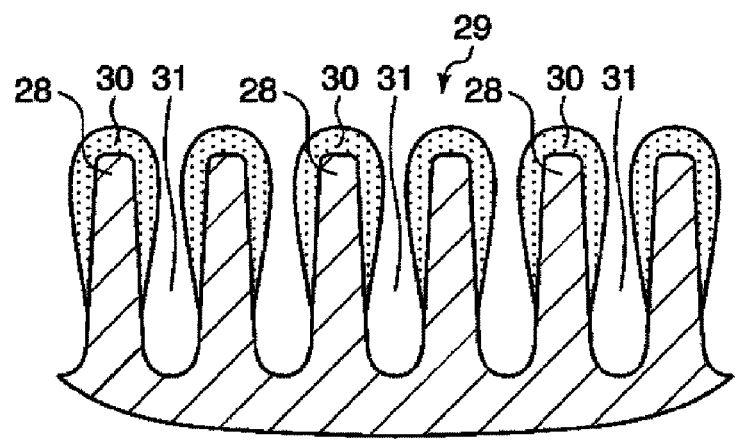
Figure 2D:
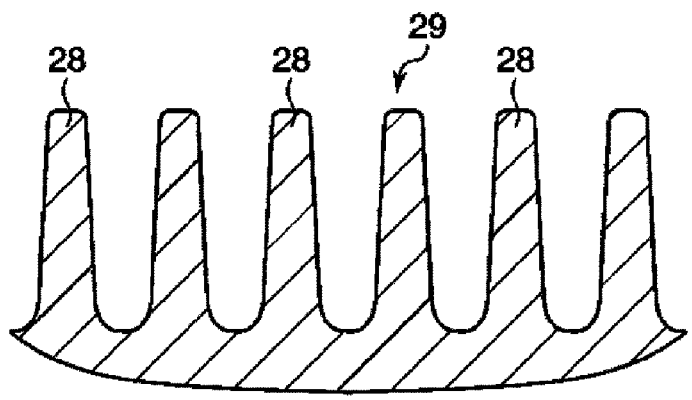

When the deposition film 30 is formed, as shown in FIG. 2B, the deposition film 30 covers the top surface and the side surfaces of each of the fins 28. However, the deposition film 30 does not cover the lower portion of each of the fins 28, for example, the bottom surface of a recess 31 sandwiched between the two adjacent fins 28. The silicon-containing film 29 remains exposed on the bottom surface. Therefore, in the subsequent COR process and the subsequent PHT process, the top surface and the side surfaces of each of the fins 28 covered with the deposition film 30 are not cut, whereas the silicon-containing film 29 exposed on the bottom surface of the recess 31 is cut. As a result, the aspect ratio of the recess 31 become large (FIG. 2C). Thereafter, an ashing process was performed on the silicon-containing film 29 using plasma generated from an oxygen ($O_2$) gas, and the deposition film 30 was removed (FIG. 2D).

It is difficult to clearly explain the reason why the deposition film 30 is not formed on the bottom surface of the recess 31. As a result of measurement of the shape of the recess 31 formed in the silicon-containing film 29, the width of the recess 31 was 25 nm and the depth of the recess 31 was 100 nm. Thus, the present inventor made the following hypothesis.

That is to say, carbon radicals 32 in plasma generated from an octafluorocyclobutane gas enters the recess 31. However, if the aspect ratio of the recess 31 (the ratio of the depth D to the width L of the recess 31 in the figures) is large (specifically, equal to or more than four), the carbon radicals 32 irregularly moving in the recess 31 are more likely to come into contact with the top surface or the side surfaces of each of the fins 28 before reaching the bottom surface of the recess 31. Then, the carbon radicals 32 in contact with the top surface and the side surfaces of each of the fins 28 are deposited as a deposit to form a deposition film 30. In other words, if the aspect ratio of the recess 31 is high, hardly any of the carbon radicals 32 reach the bottom surface of the recess 31. As a result, the deposition film 30 is not formed on the bottom surface of the recess 31. The present disclosure is based on the above findings.

FIGS. 4A to 4D are process diagrams for explaining a selective silicon-containing film removal process as a substrate processing method according to the present embodiment.

Figure 4A:
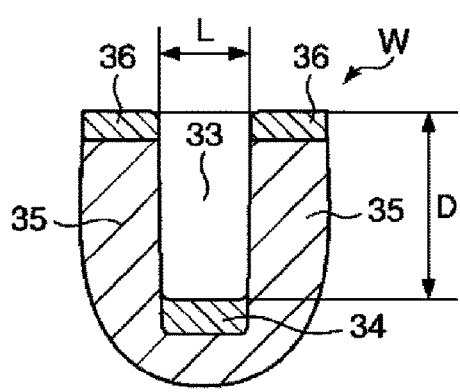
FIGS. 4A to 4D are process diagrams for explaining a selective silicon-containing film removal process as a substrate processing method according to an embodiment of the present disclosure.

First, as shown in FIG. 4A, a wafer W made of silicon (Si) and having a recess 33 formed in its surface is prepared. On the bottom surface of the recess 33 of the wafer W, a first silicon-containing film 34 made of, for example, silicon oxide ($SiO_2$) is formed as an interlayer film. On both sides 35 of the recess 33, a second silicon-containing film 36 made of, for example, silicon oxide, is formed as an interlayer film. The first silicon-containing film 34 is formed of a thermal oxide film, and the second silicon-containing film 36 is formed of a CVD oxide film. Further, the aspect ratio of the recess 33 (the ratio of the depth D to the width L of the recess 33 in FIG. 4) is set to 4 or more. Incidentally, the first silicon-containing film 34 and the second silicon-containing film 36 may not be composed of silicon oxide but may be composed of any one of silicon (Si), silicon nitride (SiN) and silicon oxycarbonitride (SiOCN). In addition, both sides 35 of the recess 33 may be formed of two protrusions made of silicon, and the second silicon-containing film 36 may be formed on the top surfaces of the respective protrusions.

Figure 4B:
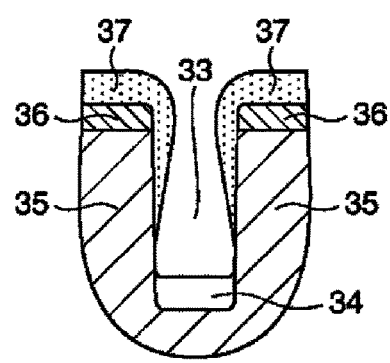

Subsequently, in the substrate processing system 10, the wafer W is first loaded into the process module 13 that executes a film forming process. A carbon-based deposition film 37 is formed on the surface of the wafer W. Specifically, an octafluorocyclobutane gas as a processing gas and an argon (Ar) gas as a dilution gas are introduced into the process module 13 whose interior has been depressurized. An electric field and a magnetic field are generated inside the process module 13 to excite the processing gas and the dilution gas, thereby generating plasma. In the interior of the process module 13, the surface of the wafer W is exposed to the plasma thus generated. Carbon radicals in the plasma are deposited as a deposit on the surface of the wafer W to form a carbon-based deposition film 37. In the process module 13, the temperature of the wafer W is maintained at 10 to 60 degrees C. High frequency power for plasma generation supplied to an upper electrode plate is set at 10 to 1,000 W. An internal pressure of the process module 13 is set at 10 to 1,000 mTorr. At this time, as described above, the aspect ratio of the recess 33 is set to 4 or more. Therefore, hardly any of the carbon radicals reach the bottom surface of the recess 33. As a result, the first silicon-containing film 34 formed on the bottom surface of the recess 33 is not covered with the carbon-based deposition film 37. On the other hand, the carbon radicals easily reach the top surfaces of the protrusions 35. Therefore, the second silicon-containing film 36 formed on the top surfaces of the protrusions 35 is covered with the carbon-based deposition film 37 (FIG. 4B).

Figure 4C:
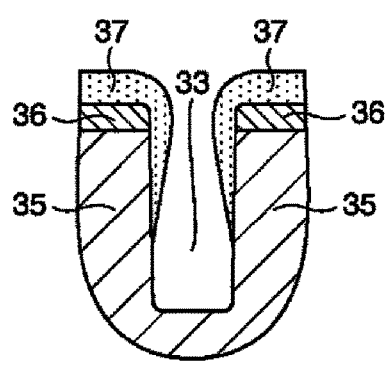

Subsequently, a COR process and a PHT process are performed on the wafer W by sequentially loading the wafer W into the process module 13 for executing the COR process and the process module 13 for executing the PHT process. At this time, since the first silicon-containing film 34 is not covered with the carbon-based deposition film 37, the first silicon-containing film 34 reacts with the ammonia gas and the hydrogen fluoride gas during the COR process and is modified into AFS. Since the second silicon-containing film 36 is covered with the carbon-based deposition film 37, the second silicon-containing film 36 does not react with the ammonia gas and the hydrogen fluoride gas during the COR process and is not modified into AFS. As a result, only the first silicon-containing film 34 is selectively removed through the COR process and the PHT process (FIG. 4C).

When performing the COR process on the wafer W, the temperature of the wafer W in the process module 13 is maintained at 10 to 150 degrees C., and the internal pressure of the process module 13 is set at 10 to 1,000 mTorr. Flow rates of the ammonia gas and the hydrogen fluoride gas are set to 10 to 1,000 sccm, respectively, and flow rates of the argon gas and the nitrogen ($N_2$) gas introduced into the process module 13 as the dilution gas are set to 0 to 500 sccm, respectively. In the prior experiments conducted by the present inventors, it has been confirmed that when the thickness of the carbon-based deposition film covering the silicon-containing film is 5 nm or more, the silicon-containing film is not cut by the COR process and the PHT process. Thus, the thickness of the carbon-based deposition film 37 covering the second silicon-containing film 36 may be 5 nm or more.

Figure 4D:
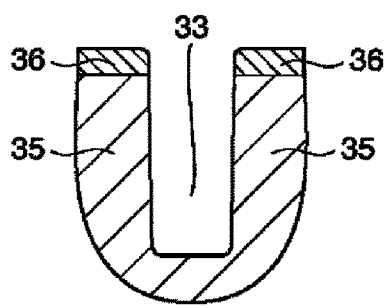

Subsequently, the wafer W is loaded into the process module 13 to be subjected to an ashing process. The ashing process is performed on the wafer W using the plasma generated from an oxygen gas, and the carbon-based deposition film 37 is removed (FIG. 4D). Thus, the present process is terminated.

According to the process of FIGS. 4A to 4D, the first silicon-containing film 34 is formed on the bottom surface of the recess 33 in the surface of the wafer W. The second silicon-containing film 36 is formed on the top surfaces of the two protrusions 35 sandwiching the recess 33 therebetween. The carbon-based deposition film 37 is formed on the surface of the wafer W by using the plasma generated from the octafluorocyclobutane gas. At this time, the carbon radicals in the plasma are deposited on the second silicon-containing film 36. Since the aspect ratio of the recess 33 is set to 4 or more, the carbon radicals do not reach the bottom surface of the recess 33. Thus, the carbon radicals are not deposited on the first silicon-containing film 34. Accordingly, in the COR process, the ammonia gas and the hydrogen fluoride gas come into contact with the first silicon-containing film 34, thereby modifying the first silicon-containing film 34 into AFS. The ammonia gas and the hydrogen fluoride gas do not make contact with the second silicon-containing film 36 and do not modify the second silicon-containing film 36 into AFS. As a result, in the wafer W in which the first silicon-containing film 34 and the second silicon-containing film 36 exist, it is possible to selectively remove the first silicon-containing film 34. In particular, since a CVD oxide film is sparse in structure as compared with a thermal oxide film, the CVD oxide film is more easily removed than the thermal oxide film in the COR process. In the wafer W described above, there is a possibility that the second silicon-containing film 36 made of a CVD oxide film is removed more preferentially than the first silicon-containing film 34 made of a thermal oxide film. By using the process shown in FIGS. 4A to 4D, it is possible to selectively remove the first silicon-containing film 34. This makes it possible to use a CVD oxide film as the second silicon-containing film 36. In this respect, the present disclosure has merit.

In the process shown in FIGS. 4A to 4D, both sides 35 of the recess 33 may be constituted by the second silicon-containing film 36. In this case, the carbon radicals entering the recess 33 move irregularly and come into contact with the side surfaces of both sides 35. Therefore, the carbon-based deposition film 37 covers not only the top surfaces but also the side surfaces of both sides 35. Accordingly, in the COR process, the ammonia gas and the hydrogen fluoride gas do not make contact with the second silicon-containing film 36, and the second silicon-containing film 36 constituting both sides 35 is not modified into AFS. As a result, even if both sides 35 are configured by the second silicon-containing film 36, there is no possibility that both sides 35 are removed.

FIGS. 5A to 5D are process diagrams for explaining a first modification of the selective silicon-containing film removal process shown in FIGS. 4A to 4D. The process shown in FIGS. 5A to 5D is different from the process shown in FIGS. 4A to 4D only in a portion of the structure of the wafer W subjected to the selective silicon-containing film removal process. Procedures and contents of the process shown in FIGS. 5A to 5D are basically the same as those of the process shown in FIGS. 4A to 4D. Therefore, duplicate structures and processes will not be described, and different structures and processes will be described below.

Figure 5A:
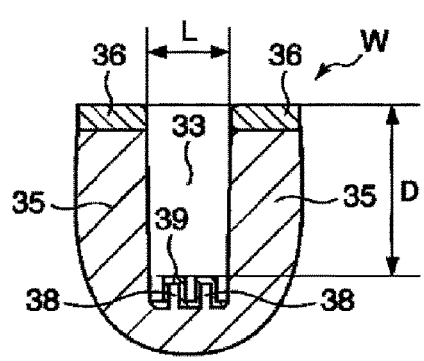
FIGS. 5A to 5D are process diagrams for explaining a first modification of the selective silicon-containing film removal process shown in FIGS. 4A to 4D.

First, as shown in FIG. 5A, a wafer W having a recess 33 formed in its surface is prepared. Fins 38 are installed to be formed upright from the bottom surface of the recess 33 of the wafer W. The fins 38 are covered with a first silicon-containing film 39 made of, for example, silicon oxide, as an interlayer film. Even in this modification, the aspect ratio of the recess 33 (the ratio of the depth D to the width L of the recess 33 in the drawing) is set to 4 or more.

Figure 5B:
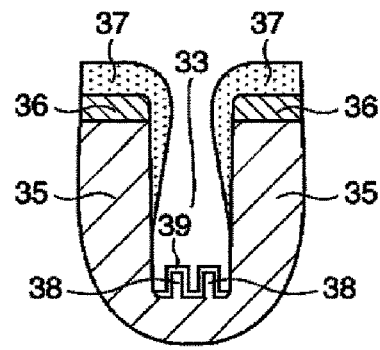

Subsequently, in the substrate processing system 10, a carbon-based deposition film 37 is formed on the surface of the wafer W by using plasma generated from a processing gas (octafluorocyclobutane gas). At this time, as described above, since the aspect ratio of the recess 33 is set to 4 or more, carbon radicals in the plasma hardly reach the bottom surface of the recess 33. As a result, the first silicon-containing film 39 is not covered with the carbon-based deposition film 37. On the other hand, the second silicon-containing film 36 is covered with the carbon-based deposition film 37 (FIG. 5B).

Figure 5C:
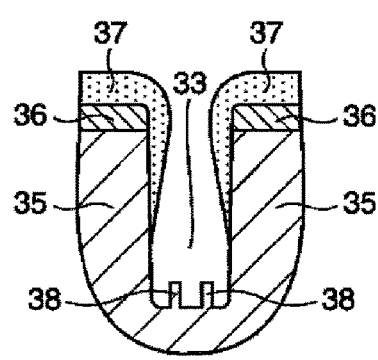
Figure 5D:
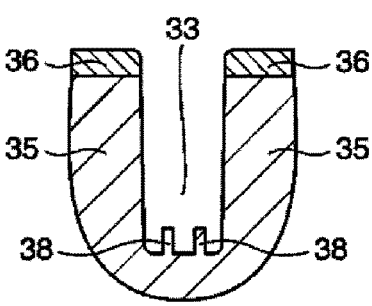

Subsequently, a COR process and a PHT process are performed on the wafer W. At this time, the second silicon-containing film 36 is covered with the carbon-based deposition film 37, and the first silicon-containing film 39 is not covered with the carbon-based deposition film 37. Thus, only the first silicon-containing film 39 is selectively removed (FIG. 5C). Thereafter, an ashing process is performed on the wafer W to remove the carbon-based deposition film 37 (FIG. 5D), whereby the present process is terminated.

According to the process of FIGS. 5A to 5D, in the wafer W in which the first silicon-containing film 39 and the second silicon-containing film 36 exist, it is possible to selectively remove the first silicon-containing film 39, whereby the fins 38 can be exposed on the bottom surface of the recess 33.

FIGS. 6A to 6D are process diagrams for explaining a second modification of the selective silicon-containing film removal process shown in FIGS. 4A to 4D. The process shown in FIGS. 6A to 6D is different from the process shown in FIGS. 4A to 4D only in a portion of the structure of the wafer W subjected to the selective silicon-containing film removal process. Procedures and contents of the process shown in FIGS. 6A to 6D are basically the same as those of the process shown in FIGS. 4A to 4D. Therefore, duplicate structures and processes will not be described, and different structures and processes will be described below.

Figure 6A:
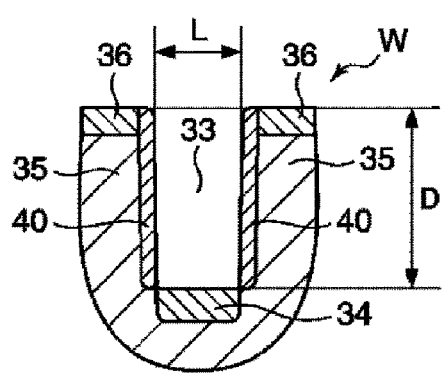
FIGS. 6A to 6D are process diagrams for explaining a second modification of the selective silicon-containing film removal process shown in FIGS. 4A to 4D.

First, as shown in FIG. 6A, a wafer W having a recess 33 formed in its surface is prepared. A nitride film 40 is formed on the side surfaces of both sides 35 of the wafer W. Even in this modification, the aspect ratio of the recess 33 (the ratio of the depth D to the width L of the recess 33 in the drawing) is set to 4 or more.

Figure 6B:
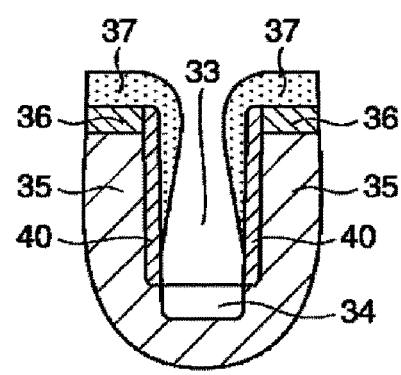

Subsequently, in the substrate processing system 10, a carbon-based deposition film 37 is formed on the surface of the wafer W by using plasma generated from a processing gas (octafluorocyclobutane gas). At this time, as described above, since the aspect ratio of the recess 33 is set to 4 or more, hardly any of the carbon radicals in the plasma reach the bottom surface of the recess 33. As a result, the first silicon-containing film 34 is not covered with the carbon-based deposition film 37. On the other hand, the second silicon-containing film 36 is covered with the carbon-based deposition film 37. The carbon radicals entering the recess 33 move irregularly and come into contact with the side surfaces of both sides 35. Thus, the carbon-based deposition film 37 also covers the nitride film 40 (FIG. 6B).

Figure 6C:
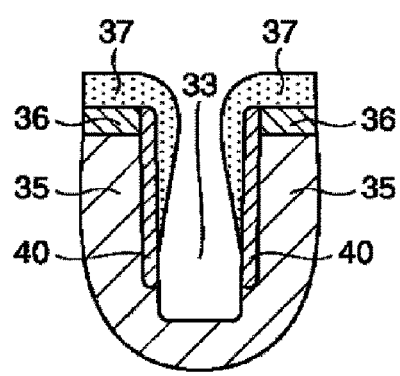
Figure 6D:
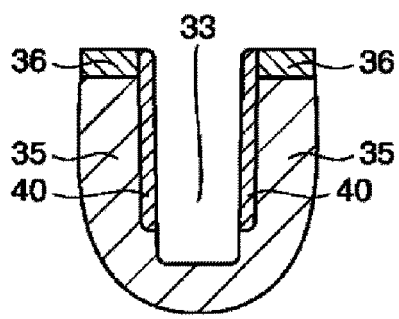

Subsequently, a COR process and a PHT process are performed on the wafer W. At this time, the second silicon-containing film 36 and the nitride film 40 are covered with the carbon-based deposition film 37, and the first silicon-containing film 34 is not covered with the carbon-based deposition film 37. Thus, only the first silicon-containing film 34 is selectively removed (FIG. 6C). Thereafter, an ashing process is performed on the wafer W to remove the carbon-based deposition film 37 (FIG. 6D), whereby the present process is terminated.

According to the process of FIGS. 6A to 6D, in the wafer W in which the first silicon-containing film 34 and the second silicon-containing film 36 exist, it is possible to selectively remove the first silicon-containing film 34. Furthermore, it is possible to prevent the nitride film 40 formed on the side surfaces of both sides 35 from being removed.

FIGS. 7A to 7D are process diagrams for explaining a third modification of the selective silicon-containing film removal process shown in FIGS. 4A to 4D. The process shown in FIGS. 7A to 7D is different from the process shown in FIGS. 4A to 4D only in a portion of the structure of the wafer W subjected to the selective silicon-containing film removal process. Procedures and contents of the process shown in FIGS. 7A to 7D are basically the same as those of the process shown in FIGS. 4A to 4D. Therefore, duplicate structures and processes will not be described, and different structures and processes will be described below.

Figure 7A:
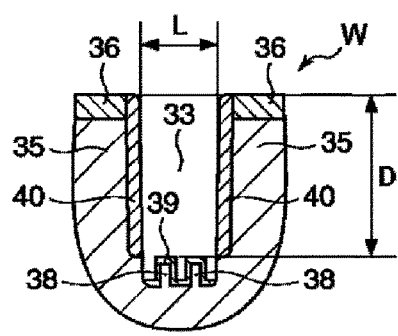
FIGS. 7A to 7D are process diagrams for explaining a third modification of the selective silicon-containing film removal process shown in FIGS. 4A to 4D.

First, as shown in FIG. 7A, a wafer W having a recess 33 formed in its surface is prepared. On the bottom surface of the recess 33 of the wafer W, fins 38 protruding upward are formed. The fins 38 are covered with a first silicon-containing film 39. A nitride film 40 is formed on the side surfaces of both sides 35. Even in this modification, the aspect ratio of the recess 33 (the ratio of the depth D to the width L of the recess 33 in the drawing) is set to 4 or more.

Figure 7B:
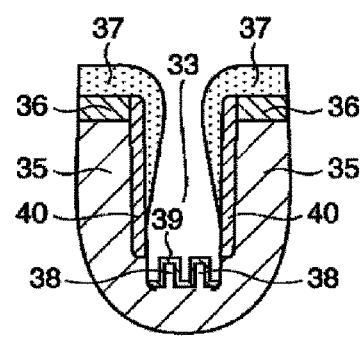

Subsequently, in the substrate processing system 10, a carbon-based deposition film 37 is formed on the surface of the wafer W by using plasma generated from a processing gas (octafluorocyclobutane gas). At this time, as described above, since the aspect ratio of the recess 33 is set to 4 or more, hardly any of the carbon radicals in the plasma reach the bottom surface of the recess 33. As a result, the first silicon-containing film 39 is not covered with the carbon-based deposition film 37. On the other hand, the second silicon-containing film 36 is covered with the carbon-based deposition film 37. The carbon-based deposition film 37 also covers the nitride film 40 (FIG. 7B).

Figure 7C:
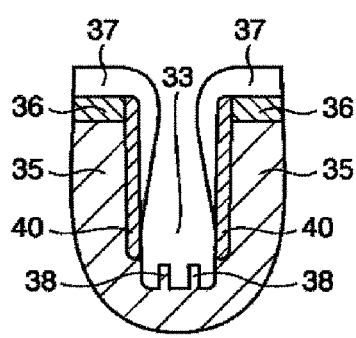
Figure 7D:
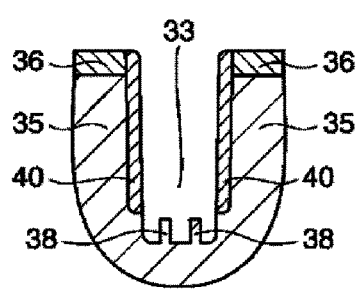

Subsequently, a COR process and a PHT process are performed on the wafer W. At this time, the second silicon-containing film 36 and the nitride film 40 are covered with the carbon-based deposition film 37, and the first silicon-containing film 39 is not covered with the carbon-based deposition film 37. Thus, only the first silicon-containing film 39 is selectively removed (FIG. 7C). Thereafter, an ashing process is performed on the wafer W to remove the carbon-based deposition film 37 (FIG. 7D), whereby the present process is terminated.

According to the process of FIGS. 7A to 7D, in the wafer W in which the first silicon-containing film 39 and the second silicon-containing film 36 exist, it is possible to selectively remove the first silicon-containing film 39 and to expose the fins 38 on the bottom surface of the recess 33. Further, it is possible to prevent the nitride film 40 formed on the side surfaces of both sides 35 from being removed.

FIGS. 8A to 8D are process diagrams for explaining a fourth modification of the selective silicon-containing film removal process shown in FIGS. 4A to 4D. The process shown in FIGS. 8A to 8D is different from the process shown in FIGS. 4A to 4D only in a portion of the structure of the wafer W subjected to the selective silicon-containing film removal process. Procedures and contents of the process shown in FIGS. 8A to 8D are basically the same as those of the process shown in FIGS. 4A to 4D. Therefore, duplicate structures and processes will not be described, and different structures and processes will be described below.

Figure 8A:
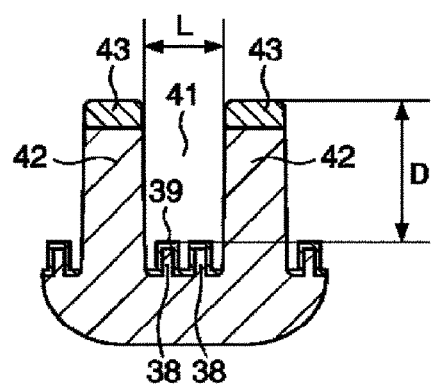
FIGS. 8A to 8D are process diagrams for explaining a fourth modification of the selective silicon-containing film removal process shown in FIGS. 4A to 4D.

First, as shown in FIG. 8A, a wafer W having recesses 41 formed in its surface is prepared. In the wafer W, the recess 41 is formed so as to be sandwiched between two adjacent fins 42 made of silicon. Fins 38 protruding upward are formed on the bottom surface of the recess 41. The fins 38 are covered with a first silicon-containing film 39. On the top surfaces of the fins 42, a second silicon-containing film 43 made of, for example, silicon oxide is formed as an interlayer film. In this modification, the aspect ratio of the recess 41 (the ratio of the depth D to the width L of the recess 41 in the drawing) is set to 4 or more.

Figure 8B:
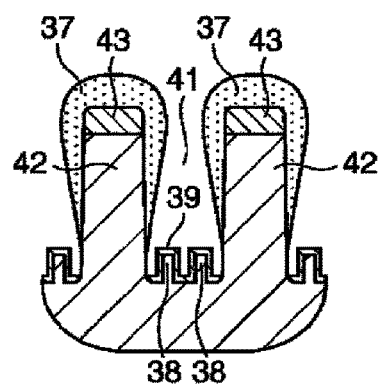

Subsequently, in the substrate processing system 10, a carbon-based deposition film 37 is formed on the surface of the wafer W by using plasma generated from a processing gas (octafluorocyclobutane gas). At this time, as described above, since the aspect ratio of the recess 41 is set to 4 or more, hardly any of the carbon radicals in the plasma reach the bottom surface of the recess 41. As a result, the first silicon-containing film 39 is not covered with the carbon-based deposition film 37. On the other hand, the second silicon-containing film 43 is covered with the carbon-based deposition film 37 (FIG. 8B).

Figure 8C:
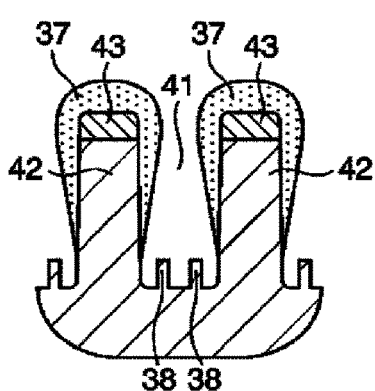
Figure 8D:
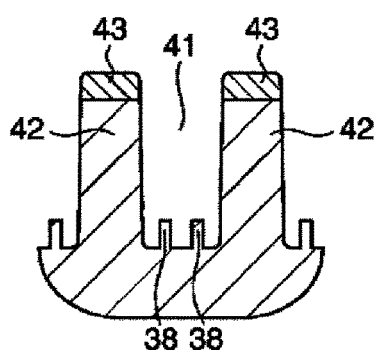

Subsequently, a COR process and a PHT process are performed on the wafer W. At this time, the second silicon-containing film 43 is covered with the carbon-based deposition film 37, and the first silicon-containing film 39 is not covered with the carbon-based deposition film 37. Thus, only the first silicon-containing film 39 is selectively removed (FIG. 8C). Thereafter, an ashing process is performed on the wafer W to remove the carbon-based deposition film 37 (FIG. 8D), whereby the present process is terminated.

According to the process of FIGS. 8A to 8D, in the wafer W where fins 38 and 42 are formed in a plurality of types and in which the first silicon-containing film 39 and the second silicon-containing film 43 are present, it is possible to selectively remove the first silicon-containing film 39 and to expose the fins 38 on the bottom surface of the recess 41.

While the present disclosure has been described above using the above-described embodiment, the present disclosure is not limited to the above-described embodiment.

For example, in the processes of FIGS. 4A to 8D described above, the first silicon-containing films 34 and 39 are formed of thermal oxide films, and the second silicon-containing films 36 and 43 are formed of CVD oxide film. However, the first silicon-containing films 34 and 39 may be formed of CVD oxide films or PVD (Physical Vapor Deposition) oxide films, and the second silicon-containing films 36 and 43 may be formed of thermal oxide films or a PVD oxide films.

Furthermore, the present disclosure may also be achieved by supplying a storage medium storing software program codes for realizing the functions of the above-described embodiment to the device controller 27 of the substrate processing system 10, and causing a CPU of the device controller 27 to read and execute the program codes stored in the storage medium.

In this case, the program codes read from the storage medium realize the functions of the above-described embodiment. The program codes and the storage medium storing the program codes constitute the present disclosure.

Examples of the storage medium for supplying the program codes may include a RAM, an NVRAM, a floppy (registered trademark) disk, a hard disk, a magneto-optical disk, an optical disk such as a CD-ROM, a CD-R, a CD-RW, a DVD (a DVD-ROM, a DVD-RAM, a DVD-RW, or a DVD+RW) or the like, a magnetic tape, a nonvolatile memory card and other ROMs, as long as they can store the program codes. Alternatively, the program codes may be supplied to the device controller 27 by downloading from another computer (not shown), a database or the like connected to the Internet, a commercial network, a local area network, or the like.

The functions of the above-described embodiment are realized by executing the program codes read out by the CPU. Furthermore, an OS (operating system) and the like operating on the CPU may perform some or all of the actual processes based on the instructions of the program codes, and the functions of the above-described embodiment may be realized by the processes thus performed.

Furthermore, after the program codes read out from the storage medium is written in the memory of a function expansion card or a function expansion unit connected to the device controller 27, the CPU of the function expansion card or the function expansion card may perform some or all of the actual processes based on the instructions of the program codes, and the functions of the above-described embodiment may be realized by the processes thus performed.

The program codes may be in the form of object codes, program codes executed by an interpreter, script data supplied to an OS, or the like.

According to the present disclosure, a first silicon-containing film is formed on a bottom surface of a recess formed in a surface of a substrate, a second silicon-containing film is formed on both sides of the recess, and a carbon-based deposit is deposited on the surface of the substrate. At this time, the carbon-based deposit is deposited on the second silicon-containing film. The carbon-based deposit does not reach the bottom of the recess. Thus, no carbon-based deposit is deposited on the first silicon-containing film. Therefore, in a COR process, a processing gas makes contact with the first silicon-containing film to modify the first silicon-containing film into a reaction product. The processing gas does not make contact with the second silicon-containing film and does not modify the silicon-containing film into a reaction product. As a result, in the environment where the first silicon-containing film and the second silicon-containing film exist, the first silicon-containing film (specific silicon-containing film) can be selectively removed through sublimation of the reaction product.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A substrate processing method performed on a substrate having a recess formed in a surface thereof, a first silicon-containing film formed on a bottom surface of the recess, a second silicon-containing film formed on both sides of the recess, comprising:
   depositing a carbon-based deposit on the surface of the substrate;
   removing the first silicon-containing film by performing a COR (Chemical Oxide Removal) process in which the first silicon-containing film is modified to a reaction product using a processing gas, on the substrate; and
   removing the deposited carbon-based deposit,
   wherein the recess has an aspect ratio of 4 or more.

2. The method of claim 1, wherein plasma generated from a fluorocarbon-based gas is used in the depositing a carbon-based deposit.

3. The method of claim 1, wherein the first silicon-containing film and the second silicon-containing film are different from each other.

4. The method of claim 1, wherein the first silicon-containing film is a thermal oxide film.

5. The method of claim 1, wherein the second silicon-containing film is a CVD (Chemical Vapor Deposition) oxide film.

6. The method of claim 1, wherein the first silicon-containing film and the second silicon-containing film are formed of the same film.

7. The method of claim 1, wherein side surfaces of the recess are covered with a nitride film.

8. The method of claim 1, wherein the substrate includes a fin installed upright from the bottom surface of the recess.

9. The method of claim 1, wherein the recess is sandwiched between two protrusions, and the second silicon-containing film is formed on a top surface of each of the two protrusions.

10. The method of claim 1, wherein each of the first silicon-containing film and the second silicon-containing film is made of any one of silicon oxide ($SiO_2$), silicon (Si), silicon nitride (SiN) and silicon oxycarbonitride (SiOCN).

* * * * *